(12) United States Patent
Freguglia et al.

(10) Patent No.: US 8,415,754 B2
(45) Date of Patent: Apr. 9, 2013

(54) CAPPED INTEGRATED DEVICE WITH PROTECTIVE CAP, COMPOSITE WAFER INCORPORATING INTEGRATED DEVICES AND PROCESS FOR BONDING INTEGRATED DEVICES WITH RESPECTIVE PROTECTIVE CAPS

(75) Inventors: Alessandro Freguglia, Bollate (IT); Luigi Esposito, Monte S. Angelo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 172 days.

(21) Appl. No.: 12/825,138

(22) Filed: Jun. 28, 2010

(65) Prior Publication Data
US 2010/0327379 A1 Dec. 30, 2010

(30) Foreign Application Priority Data
Jun. 29, 2009 (IT) .............................. TO2009A0492

(51) Int. Cl.
*B81C 1/00* (2006.01)
*H01L 21/52* (2006.01)

(52) U.S. Cl.
USPC ............. 257/416; 257/704; 257/417; 438/51; 438/106; 438/53

(58) Field of Classification Search .................. 257/415, 257/499, 704, 419; 438/51, 127
See application file for complete search history.

(56) References Cited

U.S. PATENT DOCUMENTS

| | | |
|---|---|---|
| 2002/0088988 A1* | 7/2002 | Silverbrook .................... 257/99 |
| 2004/0065928 A1* | 4/2004 | Kuo et al. ...................... 257/390 |
| 2004/0065932 A1* | 4/2004 | Reichenbach et al. ........ 257/415 |
| 2005/0195049 A1 | 9/2005 | Huang et al. |
| 2007/0238262 A1* | 10/2007 | Summers ...................... 438/455 |
| 2008/0131662 A1 | 6/2008 | Jordan et al. |
| 2008/0217752 A1 | 9/2008 | Hata et al. |
| 2009/0079037 A1 | 3/2009 | Weber et al. |
| 2009/0127639 A1 | 5/2009 | Suzuki et al. |

FOREIGN PATENT DOCUMENTS
JP 2009-14469 A 1/2009

* cited by examiner

*Primary Examiner* — Olik Chaudhuri
*Assistant Examiner* — Wilner Jean Baptiste
(74) *Attorney, Agent, or Firm* — Seed IP Law Group PLLC (57) ABSTRACT

A capped integrated device includes a semiconductor chip, incorporating an integrated device and a protective cap, bonded to the semiconductor chip for protection of the integrated device by means of a bonding layer made of a bonding material. The bonding material forms anchorage elements within recesses, formed in at least one between the semiconductor chip and the protective cap.

16 Claims, 7 Drawing Sheets

CAPPED INTEGRATED DEVICE WITH PROTECTIVE CAP, COMPOSITE WAFER INCORPORATING INTEGRATED DEVICES AND PROCESS FOR BONDING INTEGRATED DEVICES WITH RESPECTIVE PROTECTIVE CAPS

BACKGROUND

1. Technical Field

The present disclosure relates to a capped integrated device with protective cap, to a composite wafer incorporating integrated devices, and to a process for bonding integrated devices with respective protective caps.

2. Description of the Related Art

As is known, several integrated electronic devices, and, in particular, microelectromechanical devices, are provided with a cap that protects from dust and other contaminating agents, as well as from impact, both during the final machining steps and in use. For example, the introduction of dust is particularly harmful for microelectromechanical devices, which have microstructures and movable parts that are very brittle and can easily get damaged.

Normally, the devices are provided in arrays in semiconductor wafers, which are bonded to further protective wafers, which form the protective caps. Composite wafers are thus provided, which are then cut into dice, each of which comprises a portion of the semiconductor wafer, containing a device, and a portion of the protective wafer, forming a cap.

The protective wafers are frequently made of semiconductor material, but, in principle, they could also be made of some other material, such as glass or a plastic material. Generally, in order to bond a semiconductor wafer incorporating the devices to a protective wafer a bonding material is used, such as, for example, a glass frit. More precisely, the bonding material is deposited in purposely provided areas of the semiconductor wafer or, more frequently, of the protective wafer, so as not to interfere with the devices incorporated. The two wafers are then bonded and kept pressed until the bonding material expands and adheres to both of them.

Conventional bonding techniques present, however, limits, especially in the case where microelectromechanical devices are provided. In this case, in fact, the surface which is to be bonded is limited by the overall dimensions of the devices, and the adhesion of the bonding material is not always sufficient to guarantee sealing thereof. In general, adhesion of the bonding layer with a semiconductor material is not sufficiently strong and there is a considerable risk of delamination, which occurs more frequently on the side of the device. In other words, when the composite wafer is cut or following upon stresses during use, the semiconductor wafer or a portion thereof containing a device tends to detach from the corresponding cap.

The risk of delamination is higher on the side of the device, which normally requires a more complex machining and for this reason presents surface irregularities and defects with greater frequency.

In the case of delamination, the device (if not the entire wafer) is in practice unusable and must be rejected.

BRIEF SUMMARY

Embodiments include a capped integrated device, a composite wafer, and a process for bonding integrated devices with respective protective caps, which is free from the above described limitations.

One embodiment is a capped integrated device that includes a semiconductor chip incorporating an integrated device; a protective cap bonded to the semiconductor chip to protect the integrated device; a bonding layer, of a bonding material, between the semiconductor chip and the protective cap; and recesses formed in at least one of the semiconductor chip and the protective cap. The bonding material includes anchoring elements positioned within the recesses.

BRIEF DESCRIPTION OF THE SEVERAL VIEWS OF THE DRAWINGS

For a better understanding of the disclosure, some embodiments thereof will now be described, purely by way of non-limiting example and with reference to the attached drawings, wherein.

DETAILED DESCRIPTION

Figure 1:
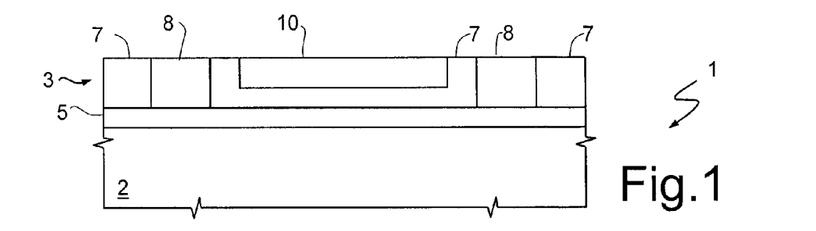
FIG. 1 is a cross section through a semiconductor wafer in an initial step of a process according to one embodiment of the present disclosure.

FIG. 1 shows a semiconductor wafer 1, which comprises a substrate 2, a pseudo-epitaxial layer 3, and an insulating layer 5, for example, made of silicon oxide, set between the substrate 2 and the pseudo-epitaxial layer 3. In the embodiment described, the substrate 2 is made of monocrystalline silicon, whereas the pseudo-epitaxial layer 3 is made of polycrystalline silicon (for example, grown from a layer of polycrystalline germ laid on the insulating layer 5).

Figure 2:
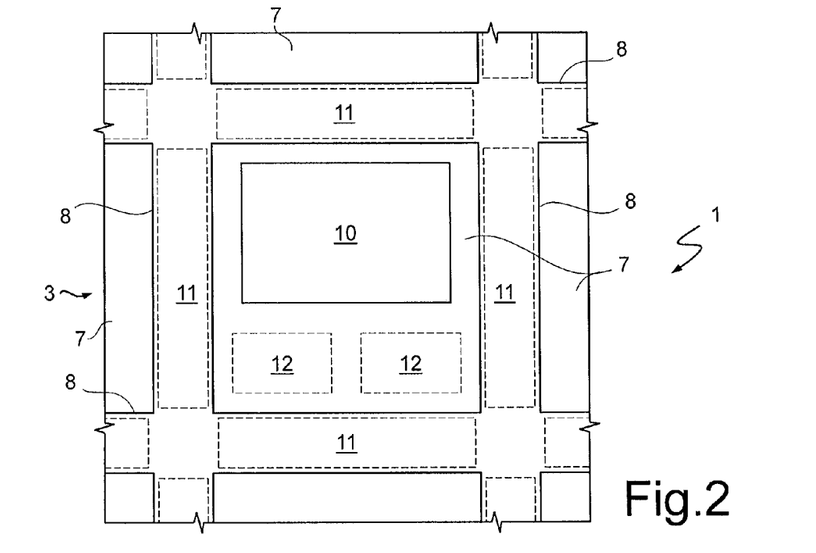
FIG. 2 is a top plan view of the semiconductor wafer of FIG. 1.

As illustrated in the top plan view of FIG. 2, defined in the pseudo-epitaxial layer 3 are, by means of known techniques, device areas 7, set adjacent to one another and separated from one another by scribing lines 8.

The semiconductor wafer 1 is machined to provide an integrated device 10, in each of the device areas 7 (the integrated devices 10 are illustrated only schematically in the attached figures). In the embodiment described, the integrated devices 10 include microelectromechanical transducers for microphones, in particular of the membrane capacitive type. It is understood, however, that in the semiconductor wafer 1 microelectromechanical devices of any other type could be provided (such as, for example, pressure sensors, linear or rotational accelerometers, microactuators, gyroscopes) or also any integrated electronic devices that benefit from application of a protective cap.

The integrated devices 10 are provided within respective device areas 7 by known procedures, the steps of which are not described in detail.

Simultaneously with fabrication of the integrated devices 10, the semiconductor wafer 1 is machined to improve the quality of the bonding.

In particular (FIG. 2), first bonding regions 11 are defined, in the scribing lines 8, and second bonding regions 12, within the device areas 7, for example in regions which are not to be occupied by movable parts of the integrated devices 10.

Figure 3:
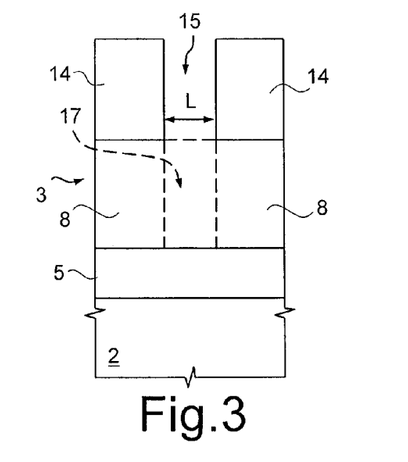
FIGS. 3 and 4 show enlarged details of the semiconductor wafer of FIG. 1, in subsequent machining steps.

Then (FIG. 3), a resist mask 14 is defined, which has a plurality of windows 15, distributed in a substantially uniform way within the first bonding regions 11 and the second bonding regions 12. In one embodiment, the windows 15 are arranged in an array and are substantially square, with a side L comprised between 5 µm and 1000 µm, for example 20 µm. The pseudo-epitaxial layer 3 is anisotropically etched through the resist mask 14. Trenches 17 are thus opened, which extend in depth as far as the insulating layer 5 and have a transverse dimension equal to the side L of the windows 15.

After removing the resist mask 14 (FIG. 4), a time-controlled, selective etch of the insulating layer 5 is carried out through the trenches 17. The insulating layer 5, which is used as a sacrificial layer, is in part removed underneath and around the trenches 17. Cavities 18 are thus formed, which communicate with respective trenches 17 and have a transverse dimension D greater than the side L of the trenches 17 themselves.

Figure 4:
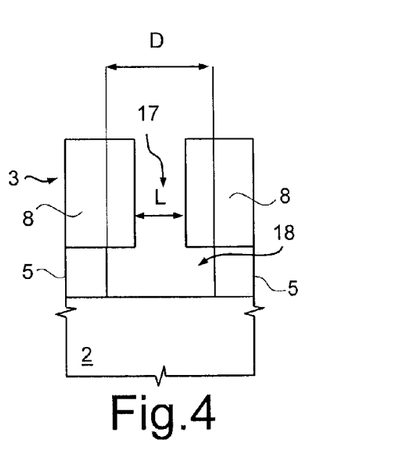
Figure 5:
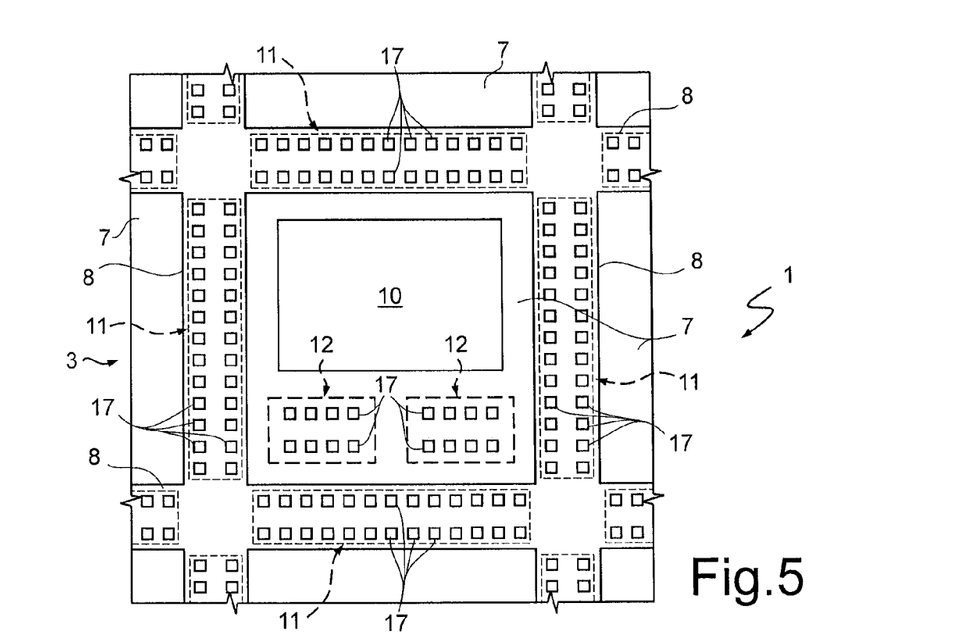
FIG. 5 is a top plan view of the semiconductor wafer of FIG. 4.

The cavities 18 and the corresponding trenches 17 form recesses, designated as a whole by the reference number 20, which are accessible from outside through the free surface of the pseudo-epitaxial layer 3. More precisely, the recesses 20 have a neck, defined by a trench 17 and open outwards, and a base, defined by a cavity 18 and larger than the respective neck.

Separately (FIG. 6), a protective wafer 22 is prepared. In one embodiment, the protective wafer 22 is made of semiconductor material, in particular monocrystalline silicon. It is understood, however, that wafers of other materials could equally be used, such as, for example, wafers made of glass, resin, or other polymeric material.

Figure 6:
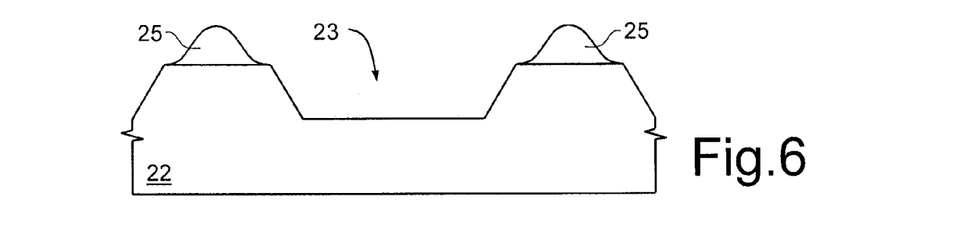
FIG. 6 is a cross section through a protective wafer.
Figure 7:
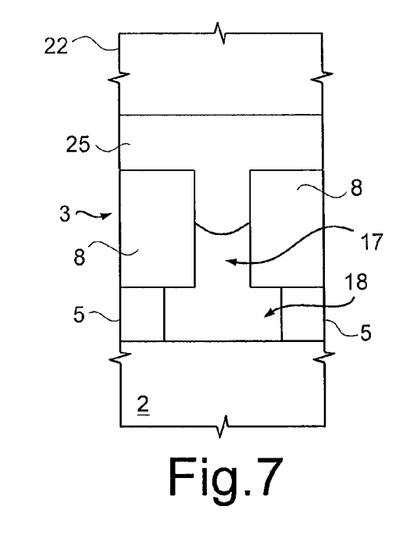
FIGS. 7 and 8 show enlarged details of a cross section through a composite wafer obtained by bonding the semiconductor wafer of FIG. 4 to the protective wafer of FIG. 6, in successive machining steps.
Figure 10:
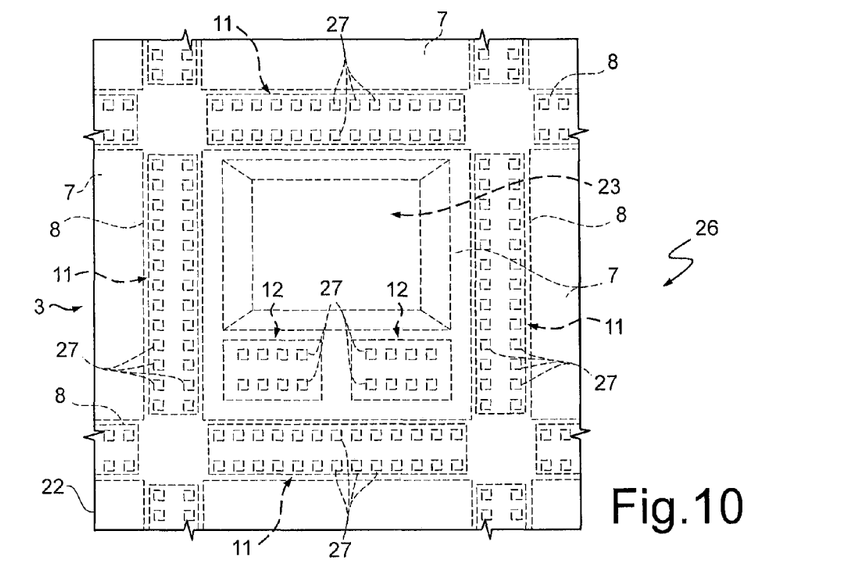
FIG. 10 is a top plan view of the composite wafer of FIG. 9.

In particular, the protective wafer 22 is selectively etched to define cavities 23, which, after bonding of the semiconductor wafer 1 and of the protective wafer 22, are arranged facing respective device areas 7, but do not extend above the second bonding regions 12 (see in this connection FIG. 10).

Possibly, the protective wafer 22 is thinned out to a desired thickness.

When the preparation of the protective wafer 22 has terminated, a bonding layer 25 is deposited on its surface around the cavity 23. In one embodiment, the bonding layer 23 is made of glass frit, but any bonding material compatible with the surfaces to be bonded could be used instead.

Figure 8:
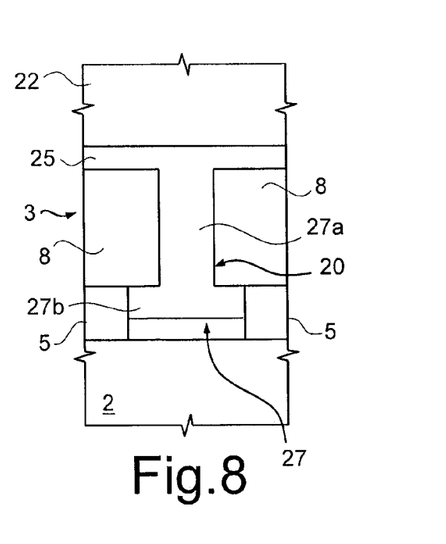
Figure 9:
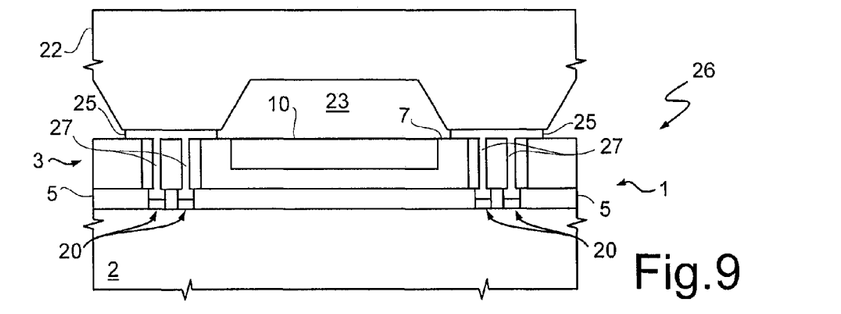
FIG. 9 is a cross section through the composite wafer of FIG. 8.

Then, the semiconductor wafer 1 and the protective wafer 22 are aligned and bonded to form a composite wafer 26, as shown in FIGS. 8 to 10.

In this step, the material of the bonding layer 25 penetrates into the recesses 20 (FIG. 8) and fills them, thus forming mushroom-shaped anchorage elements or inserts 27 when it hardens (FIG. 9). In particular, each insert 27 has a stem 27a, which extends through the neck of the respective recess 20 (trenches 17), and a head 27b, housed in the corresponding cavity 18 and wider than the respective stem 27a. The head 27b is then embedded in the semiconductor wafer 1.

Figure 11:
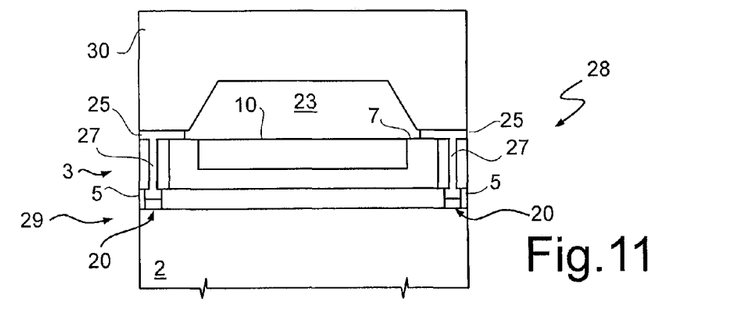
FIG. 11 is a cross section through a capped integrated device according to one embodiment of the present disclosure, obtained from cutting the composite wafer of FIGS. 9 and 10.
Figure 12:
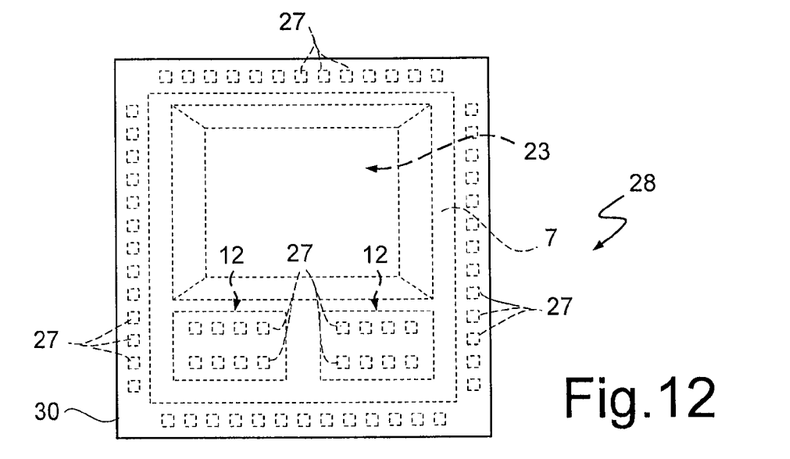
FIG. 12 is a top plan view of the capped integrated device of FIG. 11.

Finally, as shown in FIGS. 11 and 12, the composite wafer 26 is cut along the scribing lines 8 and divided into composite dice, each of which forms a capped integrated device 28 and comprises a chip 29, incorporating an integrated device 10, and a cap 30 obtained from the protective wafer 22. In addition, each capped integrated device 28 comprises respective inserts 27 in residual portions of the first bonding regions 11 and in the second bonding regions 12.

The inserts 27 which engage the recesses 20 determine mechanical blocking between the semiconductor wafer 1 (or the chips 29) and the bonding layer 25, in addition to the customary effect of adhesion. Blocking is rendered particularly effective by the mushroom shape of the inserts 27, which have their heads 27b wider than their stems 27a and than necks (trenches 17) of the respective recesses 20. Consequently, the risk of delamination during the machining steps or in use is substantially eliminated. The process described is also advantageous because it does not require the addition of dedicated machining steps and can exploit steps of masking and etching already normally envisaged for the fabrication of integrated microelectromechanical and electronic devices.

Figure 13:
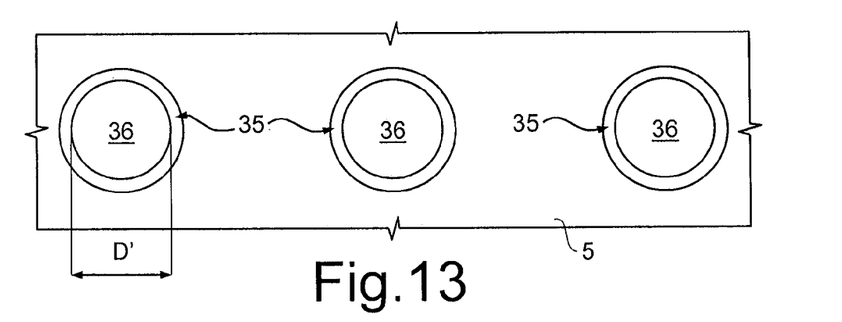
FIG. 13 is a top plan view of a portion of a semiconductor wafer in an intermediate step of a process according to a different embodiment of the present disclosure.
Figure 14:
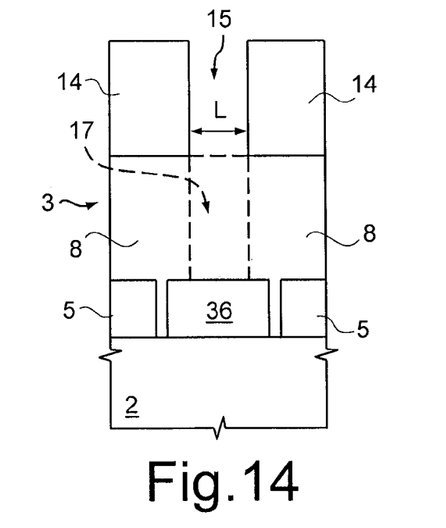
FIGS. 14 and 15 are cross sections through the wafer of FIG. 13 in successive machining steps.
Figure 15:
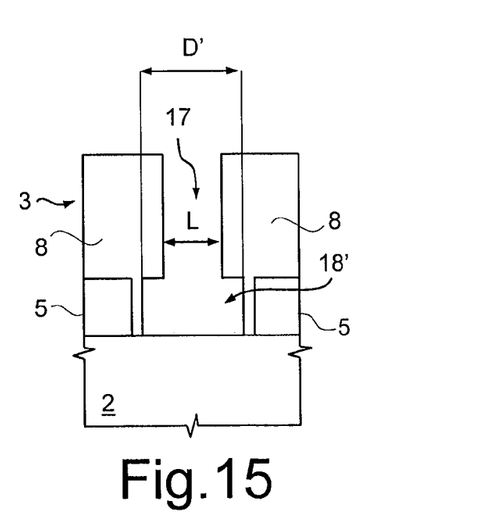

According to a variant of the process described, to which FIGS. 13-15 refer, the insulating layer 5 is etched before the pseudo-epitaxial layer 3 is formed. In this step, in particular, trenches 35 are opened, which develop along closed lines (for example circular, as in FIG. 13, or else square or rectangular) around regions where the inserts 27 will subsequently be formed. The trenches 35 delimit isles 36, having a maximum transverse dimension D', from the rest of the insulating layer 5. The pseudo-epitaxial layer 3, during growth, penetrates into the trenches 35 and fills them completely. Using the resist mask 14 (FIG. 14), in the pseudo-epitaxial layer 3, the trenches 17 are then opened, which are aligned to the isles 36 and are preferably coaxial to the trenches 35.

Next (FIG. 15), when the insulating layer 5 is selectively etched through the trenches 17, only the isles 36 are removed and the etching stops laterally against the portions of the pseudo-epitaxial layer 3 grown in the trenches 35. In this way, the transverse dimension D' of the cavity 18' can be controlled precisely and does not substantially depend upon the etching time.

In the embodiment described previously, blocking by inserts has been limited to the semiconductor wafer 1 (and hence to the chips 29). As already mentioned, in fact, normally the greater problems of adhesion are encountered on the side of the devices, which are made using a more complex machining and entail a higher likelihood of imperfections.

Figure 16:
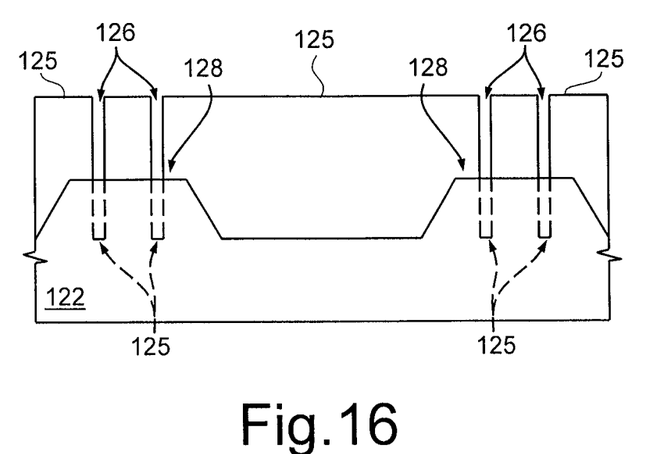
FIGS. 16 and 17 are cross sections through a protective wafer in successive machining steps of a process according to another embodiment of the present disclosure.
Figure 17:
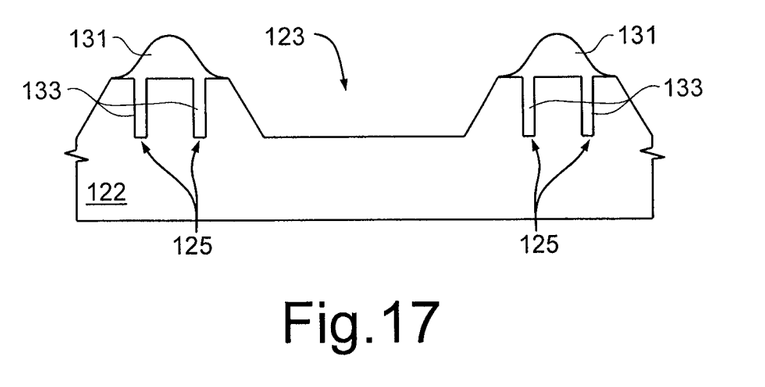
Figure 18:
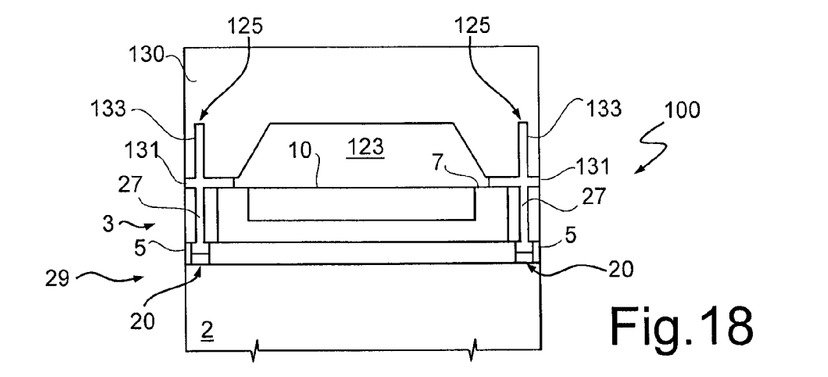
FIG. 18 is a cross section through a capped integrated device according to another embodiment of the present disclosure, obtained by cutting a composite wafer formed by bonding the semiconductor wafer of FIGS. 4 and 5 to the protective wafer of FIG. 14.

However, if need be, the inserts can be provided also on the side of the cap, as shown in the embodiment of FIGS. 16-18, where parts that are the same as the ones already illustrated are designated by the same reference numbers.

In this case, the semiconductor wafer 1 is machined as already described, whilst a protective wafer 122 is selectively etched through a resist mask 125 to form trenches 126 (FIG. 16). In particular, the trenches 126 are provided in third bonding regions 128, which are arranged between cavities 123 and correspond to the first bonding regions 11 and to the second bonding regions 12 of the semiconductor wafer 1.

A bonding layer 131 is then laid on the protective wafer 122 and fills the trenches 126, forming inserts 133 substantially shaped like rectilinear pins (FIG. 17).

Then, the semiconductor wafer 1 and the protective wafer 122 are aligned and bonded to form a composite wafer (not shown), which is cut to form composite dice, which define capped integrated devices 100 (FIG. 18). Each capped integrated device 100 comprises a chip 29, incorporating an integrated device 10, and a cap 130 obtained from the protective wafer 122.

In the bonding step, the bonding layer 131 penetrates also within the trenches 17 of the semiconductor wafer 1 to form the inserts 27.

Figure 19:
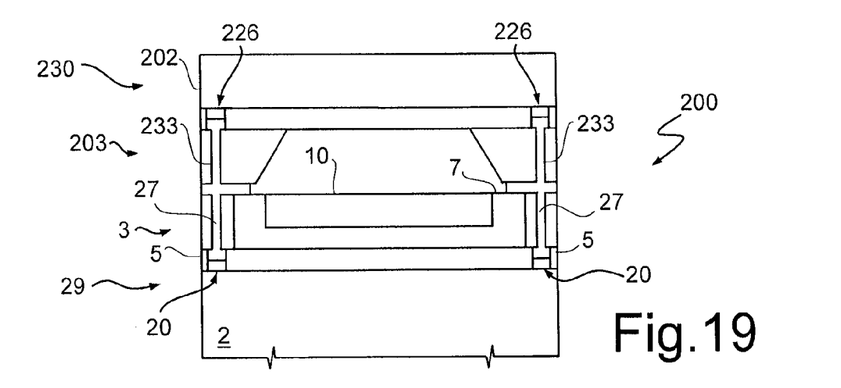
FIG. 19 is a cross section through a capped integrated device according to another embodiment of the present disclosure.

FIG. 19 shows a different embodiment, in which a capped integrated device 200 comprises the chip 29 and a cap 230 and is obtained by bonding and cutting the semiconductor wafer 1 and a protective wafer (not shown completely) comprising a buried insulating layer 205 arranged between a substrate 202 and a pseudo-epitaxial layer 203. In this case, recesses 226 are formed in the cap 230, with neck and base having a cross section larger than that of the neck, and then inserts 233 having a mushroom shape. The process used is substantially identical to the one employed for obtaining the recesses 20 and the inserts 27 in the chip 29.

Figure 20:
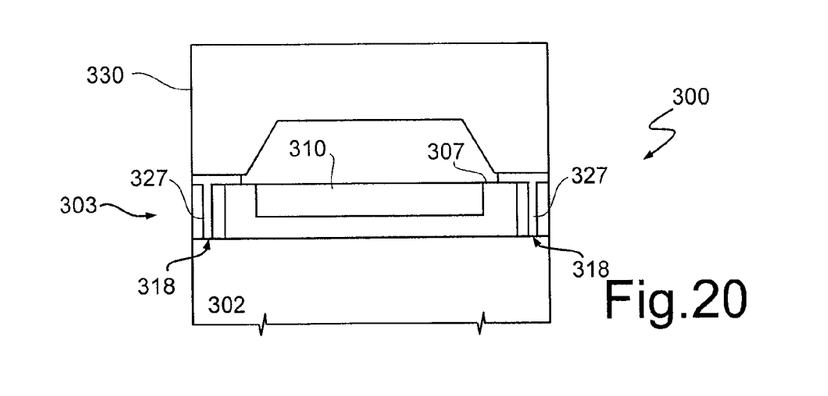
FIG. 20 is a cross section through a semiconductor wafer according to a further embodiment of the present disclosure.

In the embodiment of FIG. 20, a capped integrated device 300 comprises a chip 329 and a cap 330. The chip 329 is obtained from a semiconductor wafer (not shown completely) comprising a substrate 302 and an epitaxial layer 303 (of monocrystalline silicon), grown directly by the substrate 302, without interposition of insulating layers. Provided in a device area 307 of the epitaxial layer 303 is an integrated device 310, for example a linear accelerometer. In addition, the epitaxial layer 303 has trenches 318, which are obtained by a time-controlled masked etch and are engaged by substantially rectilinear inserts 327.

Figure 21:
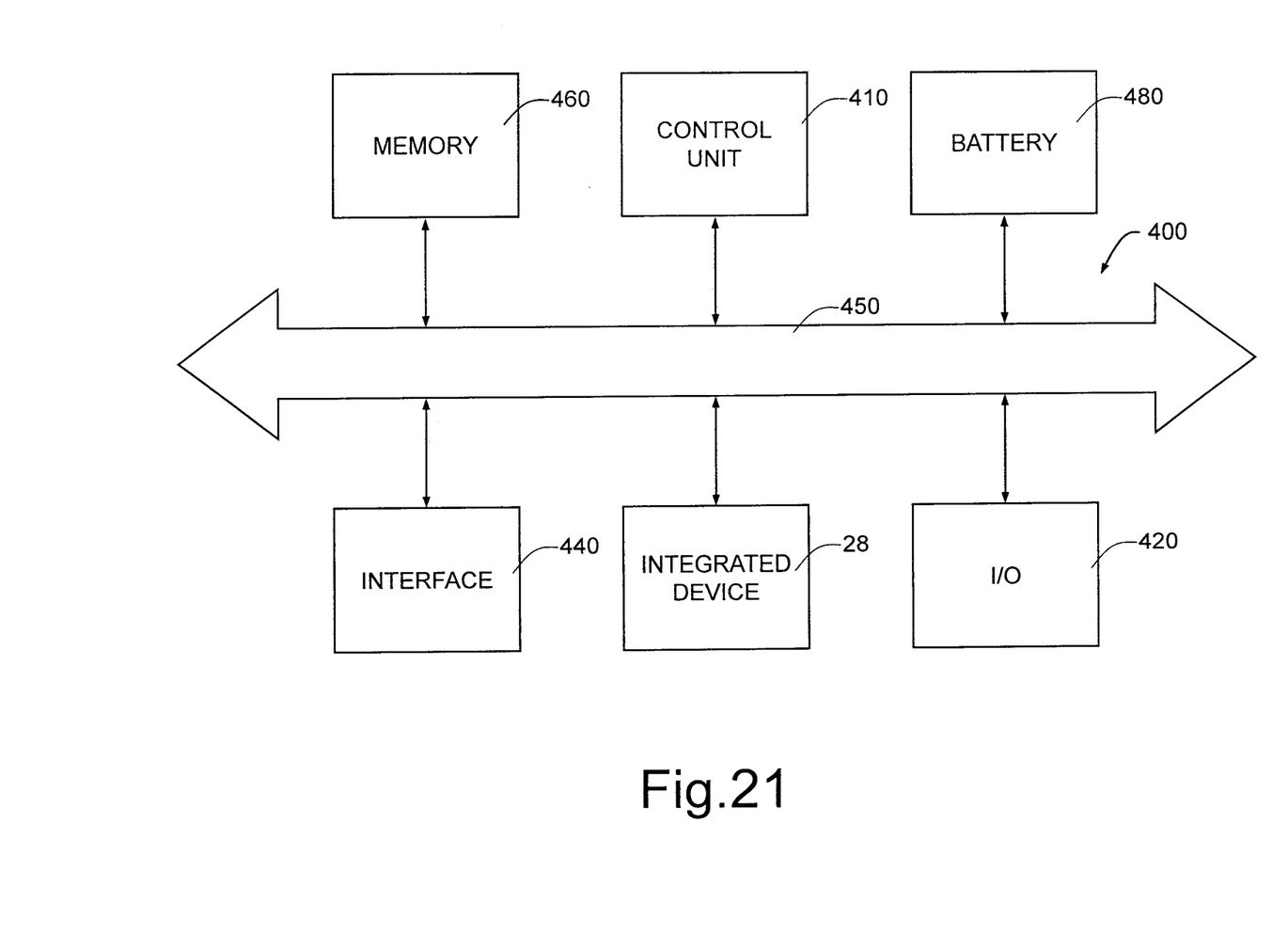
FIG. 21 is a simplified block diagram of an electronic system incorporating a capped integrated device according to one embodiment of the present disclosure.

Illustrated in FIG. 21 is a portion of a system 400 according to one embodiment of the present disclosure. The system 400 can comprise a controller 410, an input/output (I/O) device 420 (for example, a keyboard or a screen), the capped integrated device 28 50, a wireless interface 440 and a memory 460, of a volatile or non-volatile type, coupled to one another through a bus 450. In one embodiment, a battery 480 can be used for supplying the system 400. It may be noted that the scope of the present disclosure is not limited to embodiments necessarily having one or all of the devices listed.

The controller 410 can comprise, for example, one or more microprocessors, microcontrollers, and the like.

The I/O device 420 can be used for generating a message. The system 400 can use the wireless interface 440 for transmitting and receiving messages to and from a wireless communication network with a radiofrequency (RF) signal. Examples of wireless interface may comprise an antenna, a wireless transceiver, such as a dipole antenna, even though the scope of the present disclosure is not limited from this standpoint. In addition, the I/O device 420 can supply a voltage representing what is stored either in the form of digital output (if digital information has been stored) or in the form of analog output (if analog information has been stored).

The system 400 can be used in apparatuses such as, for example, a palm-top computer (personal digital assistant, PDA), a laptop or portable computer, possibly with wireless capacity, a cellphone, a messaging device, a digital musical player, a digital camera, or other devices.

Finally, it is clear that modifications and variations may be made to the capped integrated device, to the composite wafer, and to the process described, without thereby departing from the scope of the present disclosure.

The density, distribution, dimensions, and total number of recesses and inserts clearly depend upon the type of integrated device, its shape, and the machining process adopted. In principle, the number of recesses and inserts is greater, the smaller the area available for bonding and the more complex the manufacturing process.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A capped integrated device comprising:
a semiconductor chip incorporating an integrated device;
a protective cap configured to protect the integrated device;
a bonding layer, of a bonding material, that bonds the semiconductor chip and the protective cap; and
a plurality of recesses formed in at least one of: a semiconductor wafer and a protective wafer, each recess including a hollow neck section connected to a hollow base section, the base section being wider than the neck section; and a plurality of anchoring elements formed from the bonding material, and positioned in the recesses, respectively, each anchoring element having a shaft positioned within the neck section of the respective recess, and a head positioned within the base section of the respective recess.

2. A device according to claim 1, wherein the anchoring elements are shaped as rectilinear pins.

3. A device according to claim 1, wherein the recesses and the anchoring elements are positioned in the semiconductor chip.

4. A device according to claim 1, wherein the recesses and the anchoring elements are positioned in the protective cap.

5. A device according to claim 1, wherein a transverse dimension of the anchoring elements is between 5 μm and 1000 μm.

6. A device according to claim 1, wherein the semiconductor chip comprises a device area, accommodating the integrated device, and wherein the recesses are arranged in first bonding region, around the device area, and in second bonding region, inside the device area.

7. A device according to claim 1, wherein the integrated device is a microelectromechanical device.

8. A device according to claim 1, wherein the chip includes:
a substrate;
a first layer positioned on the substrate and including a cavity forming the base of one of the recesses; and
a second layer positioned on the first layer and including a trench forming the neck of the one of the recesses, wherein the head of one of the anchoring elements includes a top side, extending from the stem, that contacts a bottom side of the second layer.

9. A system comprising:
a control unit; and
a capped integrated device coupled to the control unit and including:
- a semiconductor chip incorporating an integrated device;
- a protective cap configured to protect the integrated device;
- a bonding layer, of a bonding material, that bonds the semiconductor chip and the protective cap; and
- a plurality of recesses formed in at least one of: a semiconductor wafer and a protective wafer, each recess including a hollow neck section connected to a hollow base section, the base section being wider than the neck section; and a plurality of anchoring elements formed from the bonding material, and positioned in the recesses, respectively, each anchoring element having a shaft positioned within the neck section of the respective recess, and a head positioned within the base section of the respective recess.

10. A system according to claim 9, wherein the semiconductor chip comprises a device area, accommodating the integrated device, and wherein the recesses are arranged in first bonding region, around the device area, and in second bonding region, inside the device area.

11. A system according to claim 9, wherein the chip includes:
- a substrate;
- a first layer positioned on the substrate and including a cavity forming the base of one of the recesses; and
- a second layer positioned on the first layer and including a trench forming the neck of the one of the recesses, wherein the head of one of the anchoring elements includes a top side, extending from the stem, that contacts a bottom side of the second layer.

12. A composite wafer comprising:
- a semiconductor wafer incorporating integrated devices;
- a protective wafer configured to protect the integrated devices;
- a bonding layer, of a bonding material, that bonds the semiconductor wafer and the protective wafer;
- a plurality of recesses formed in at least one of: the semiconductor wafer and the protective wafer, each recess including a hollow neck section connected to a hollow base section, the base section being wider than the neck section; and
- a plurality of anchoring elements formed from the bonding material, and positioned in the recesses, respectively, each anchoring element having a shaft positioned within the neck section of the respective recess, and a head positioned within the base section of the respective recess.

13. A composite wafer according to claim 12, wherein the anchoring elements are shaped as rectilinear pins.

14. A composite wafer according to claim 12, wherein the semiconductor wafer comprises a plurality of device areas, each accommodating a respective one of the integrated devices, and wherein the recesses are arranged in first bonding regions, around the device areas, and in second bonding regions, inside the device areas.

15. A composite wafer according to claim 14, wherein the first bonding regions are arranged in scribing lines.

16. A composite wafer according to claim 12, wherein the semiconductor wafer includes:
- a substrate;
- a first layer positioned on the substrate and including a cavity forming the base of one of the recesses; and
- a second layer positioned on the first layer and including a trench forming the neck of the one of the recesses, wherein the head of one of the anchoring elements includes a top side, extending from the stem, that contacts a bottom side of the second layer.

* * * * *